(12) United States Patent
Ganai et al.

(10) Patent No.: US 7,386,818 B2
(45) Date of Patent: Jun. 10, 2008

(54) EFFICIENT MODELING OF EMBEDDED MEMORIES IN BOUNDED MEMORY CHECKING

(75) Inventors: Malay Ganai, Plainsboro, NJ (US);
Aarti Gupta, Princeton, NJ (US);
Pranav Ashar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 144 days.

(21) Appl. No.: 11/037,920

(22) Filed: Jan. 18, 2005

(65) Prior Publication Data

US 2006/0190864 A1 Aug. 24, 2006

Related U.S. Application Data

(60) Provisional application No. 60/538,526, filed on Jan. 22, 2004.

(51) Int. Cl.
*G06F 17/50* (2006.01)
(52) U.S. Cl. .......................................... 716/5
(58) Field of Classification Search ............... 716/4–5; 703/2; 714/33, 37, 799
See application file for complete search history.

(56) References Cited

U.S. PATENT DOCUMENTS

| 2001/0001881 | A1 | 5/2001 | Mohan et al. | |
| 2004/0078674 | A1* | 4/2004 | Raimi et al. | 714/33 |
| 2004/0153983 | A1* | 8/2004 | McMillan | 716/5 |
| 2005/0149837 | A1* | 7/2005 | Jain | 714/794 |

OTHER PUBLICATIONS

Velev, M. et al., "Efficient Modeling of Memory Arrays in Symbolic Simulation", Computer-Aided Verification /97, Jun. 1997, pp. 388-399.
Bryant, R.E et al., "Processor Verification Using Efficient Reductions of the Logic of Uninterpreted Functions to Propositional Logic", ACM Transactions on Computational Logic, vol. 2, No. 1, Jan. 2001, pp. 93-134.
Burch, J.R. et al., "Automatic Verification of Pipelined Microprocessor Control", Proceedings of the Sixth International Conference on Computer-Aided Verification, vol. 818, 1994, pp. 68-80.
Bryant, R.E. et al., "Modeling and Verifying Systems Using a Logic of Counter Arithmetic with Lambda Expressions and Uniterpreted Functions", CAV 2002, LNCS 2404, Springer-Verlag Berlin Heidelberg 2002, pp. 78-92.
Velev, M.N., "Automatic Abstraction of Memories in the Formal Verification of Superscalar Microprocessors", TACAS 2001, LNCS 2031, Springer-Verlag Berlin Heidelberg 2001, pp. 252-267.

* cited by examiner

*Primary Examiner*—Paul Dinh
(74) *Attorney, Agent, or Firm*—Brosemer, Kolefas & Associates

(57) ABSTRACT

A computer-implemented method for augmenting SAT-based BMC to handle embedded memory designs without explicitly modeling memory bits. As is known, verifying designs having large embedded memories is typically handled by abstracting out (over-approximating) the memories. Such abstraction is not useful for finding real bugs. SAT-based BMC, as of now, is incapable of handling designs with explicit memory modeling due to enormously increased search space complexity. Advantageously, our method does not require analyzing the designs and also guarantees not to generate false negatives.

22 Claims, 11 Drawing Sheets

```
                                          //
BMC-1 (n,P) {                             //Check safety property P within bound n
   CP⁰==1; LR⁻¹==φ;
   for (int i=0; i<=n; i++) {
      Pⁱ = Unroll(P,i);                   //Get property node at iᵗʰ unrolled frame
      if (SAT_Solve)(I^LFPⁱ)=UNSAT or
         SAT_Solve((LFPⁱ^¬Pⁱ ^ CPⁱ )=UNSAT) {
         return PROOF;                    //Fwd and bwd termination check
      if SAT_Solve((I^¬Pⁱ)=SAT) return CE; //Falsify
      CPⁱ⁺¹ = CPⁱ ^ Pⁱ ;                  //update CP
      U_Core=SAT_Get_Refutation();        //Get proof of Unsat
      LRⁱ = LRⁱ⁺¹ ∪ Get_Latch_Reasons(U_Core);}
   Return NO_CE; }                        //No counter-example found
```

```
SAT_Solve(P=1)           { //Check if constraint P=1 satisfiable?
while(Decide()=SUCCESS)    //Selects a new variable
  while(Deduce()=CONFLICT) //BCP till conflict/no-conflict
    if (Diagnose()=FAILURE) //Add conflict learnt clause(s)
      return UNSAT;         //Conflict found at decision level 0
return SAT;} //No more decision to make
```

FIG. 3

```
BMC-1 (n,P) {
  CP⁰==1; LR⁻¹==φ;                                      //Check safety property P within bound n
  for (int i=0; i<=n; i++) {
    Pⁱ = Unroll(P,i);                                    //Get property node at iᵗʰ unrolled frame
    if (SAT_Solve)(I^LFPⁱ)=UNSAT or
       SAT_Solve((LFPⁱ^¬Pⁱ ^ CPⁱ )=UNSAT) {              //Fwd and bwd termination check
      return PROOF;                                      //Falsify
    if SAT_Solve((I^¬Pⁱ)=SAT) return CE;                 //update CP
    CPⁱ⁺¹ = CPⁱ ^ Pⁱ ;                                   //Get proof of Unsat
    U_Core=SAT_Get_Refutation();
    LR̄ⁱ = LRⁱ⁺¹ ∪ Get_Latch_Reasons(U_Core);}
  Return NO_CE; }                                        //No counter-example found
```

FIG. 4

```
BMC-2 (n, P)                                    {// BMC with EMM
  C⁻¹=ϕ; // initialize memory modeling constraints
  for (int i=0; i<=n ; i++) {
    Pⁱ = Unroll(P,i); // get property node at iᵗʰ unrolling
    Cⁱ = Cⁱ⁻¹ ∪ EMM_Constraints(i); // update the constraints
    if (SAT_Solve(I∧¬Pⁱ∧Cⁱ)=SAT) return CE;}
  return NO_CE; } // no counter-example found
```

FIG. 6

```
EMM_Constraints(k,C) {                          //Modeling of memory constraint at depth k
                                                //where C is cumulative constraints up to
                                                //a depth of k-1
    Gen_Addr_Equal_Sig(k);                      //Generate Address Equal Signals
    Gen_Valid_Read_Sig(k);                      //Generate Exclusive Valid Read Signals
    C(k) = Gen_Read_Date_Constraints(k);        //Generate Constraints on Read Data
    return C ∪ C(k);
```

FIG. 7

```
BMC-3 (n, P){                                              // Check safety property P within bound n
  CP⁰=1; LR⁻¹=Φ; C⁻¹=Φ;
  for (int i=0; i<=n ; i++) {
    Pⁱ = Unroll(P,i);  // property node at iᵗʰ unrolling
    Cⁱ = Cⁱ⁻¹ ∪ EMM_Constraints(i);    // update the constraints
    if (SAT_Solve(I∧LFPⁱ∧Cⁱ)=UNSAT or
        SAT_Solve(LFPⁱ∧¬Pⁱ∧CPⁱ∧Cⁱ)=UNSAT) {   // bwd and fwd termination check
      return PROOF;}
    if (SAT_Solve(I∧¬Pⁱ∧Cⁱ)=SAT) return CE;
    CPⁱ⁺¹ = CPⁱ∧Pⁱ;  // update CP
    U_Core = SAT_Get_Refutation();   // get proof of UNSAT
    LRⁱ = LRⁱ⁻¹ ∪ Get_Latch_Reasons(U_Core);}
  return NO_CE; }                      // no counter-example found
```

FIG. 9

```
1.   //Program: Fibonacci
2.   //uses only recursion
3.   fib(n) {
4.     if (n==0) return 0;
5.     if (n==1) return 1;
6.     return fib(n-1)+fib(n-2);
7.   }
8.   //Program: Fibonacci
9.   //uses cache and recursion
10.  fib-c(n) {
11.    if (n==0) return 0;
12.    if (n==1) return 1;
13.    //cache lookup
14.    if (lookup(n,&f)) return f;
15.    f = fib(n-1)+fib(n-2);
16.    //insert cache
17.    store(n,f);
18.    return f;
19.  }
20.  //Program 3n+1
21.  //period tracks # of calls
22.  //required to converge
23.  //initialized to 0
24.  3nPlus1(n) {
25.    if (n==1) return;
26.    if ((odd(n))
27.      3nPlus1(3*n+1);
28.    else
29.      3nPlus1(n/2);
30:    period++;
31.  }
32.  //Program: Tower of Hanoi
33.  //count tracks # of moves
34.  //required, initialized to 0
35.  toh(n,s,d,a) {
36.    if (n==0) return;
37.    toh(n-1,s,a,d);
38.    count++;
39.    toh(n-1,a,d,s);
40.  }
```

FIG. 10

```
1.  //Random Access Memory
2.  `define AW 12//address width
3.  `define DW 32//Data Size
4.  `define SZ 4096//Memory Size
5.
6.  module mem(Addr,WD,RD,WE);
7.  input [`AW-1] Addr;
8.  input WE;
9.  output [`DW-1:0] RD;
10. intput [`DW-1:0] WD;
11. reg [`DW-1] mem [`SZ-1:0];
12.
13. assign RD = mem[Addr];
14.
15. always @ (WE or Addr or WD)
16.   if (WE) mem[Addr] <= WD;
17.
18. endmodule
19.
20.
21. //Stack model using RAM
22. module Stack(op,Din,Dout
23. //op=2 (PUSH), 1(POP), 0(NOP)
24. input op;
25. //push value
26. input [`DW-1:0] Din;
27. //pop value
28. output [`DW-1:0] Dout;
29. reg WE;
30. reg [`AW-1:0] SP;
31: initial SP=0;
32.
33. always @(posedge clk) begin
34.   if (op==`PUSH)
35.     SP<= SP+1;
36.   else if (op ==`POP)
37.     SP <= SP-1;
38.   WE <= (op ==`PUSH); end
39.
40. mem(SP, Din, Dout, WE);
41  endmodule
```

FIG. 11

EFFICIENT MODELING OF EMBEDDED MEMORIES IN BOUNDED MEMORY CHECKING

CROSS REFERENCE TO RELATED APPLICATIONS

This application claims the benefit of U.S. Provisional Application No. 60/538,526 filed Jan. 22, 2004, the entire file-wrapper contents of which are incorporated by reference as if set forth at length herein.

FIELD OF THE INVENTION

This invention relates generally to the field of digital circuits and in particular it relates to techniques useful for the formal verification of digital circuits.

BACKGROUND OF THE INVENTION

Formal verification techniques such as symbolic model checking (SMC)—that use binary decision diagrams (BDDs)—offer the potential of exhaustive coverage and the ability to detect subtle bugs unlike traditional techniques such as simulation. These techniques that use BDDs however, are known to suffer from a state explosion problem and consequently fail for circuits having a large number of flip-flops/state variables.

Boolean Satisfiability (SAT) solvers have exhibited numerous attributes that make them attractive complements to BDDs. In particular, their performance is less sensitive to size and they typically do not suffer from the state explosion problem noted before. As a result, the development of routines that perform bounded model checking (BMC) utilizing SAT methodologies has been the subject of much research.

Unlike symbolic model checking, BMC focuses on finding bugs of bounded length, and successively increases the boundaries in search of longer traces. Given a design and a correctness property, BMC generates a Boolean formula, such that the formula is true if and only if there exists a witness/counterexample of length k. This Boolean formula is then checked by a backend SAT solver. Advantageously, and due in part to recent advances made to SAT solvers, SAT-based BMC can handle much larger designs and analyze them faster then ever before.

By way of example, Burch and Dill, in a paper entitled "Automatic Verification of Pipelined Microprocessor Control" which appeared in *Proceedings of the sixth International Conference on Computer-Aided Verification*, volume 818, D. L. Dill, Ed.: Springer-Verlag, 1994, pp. 68-80, introduced symbolic representation of memory arrays in their logic of equality with un-interpreted functions. Their abstract interpretation of memory uses interpreted read and write operations. These interpreted functions are used to represent the memory symbolically by creating nested if-then-else (ITE) structure to record the history of writes to the memory.

In an effort to model an entire circuit with control and data memory, Velev et al., in an article entitled "Efficient Modeling of Memory Arrays in Symbolic Simulation", that appeared in Computer Aided Verification, O. Grumberg, Ed., pp. 399-399 in 1987, introduced a behavioral model that allows the number of symbolic variables used to be proportional to the number of memory accesses rather than to the size of the memory. This model replaces the memory and it interacts with the rest of the circuit through a software interface. Similar to that shown by Burch and Dill, the Velev et al. read and write operations are defined in such a way that the forwarding property of the memory semantics (i.e., data read from a memory location is the same as the recent data written at the same location) is satisfied. Unfortunately however, BDDs used to represent the Boolean expressions tend to "blowup" for processors with branch or load/store instruction(s) and good BDD ordering is not possible due to dependencies of address on the data and vice-versa.

In an article entitled "Processor Verification Using Efficient Reductions for the Logic of Uninterpreted Functions to Propositional Logic", that appeared in ACM Transactions on Computational Logic (TOCL) on pp. 93-134, Vol., 2, No. 1, in January 2001, R. E. Bryant, S. German, and M. N. Velev discovered that for processors in which writes are not reordered relative to each other or to reads, it is sufficient to represent data memory as a generic state machine, changing state in some arbitrary way for each write operation, and returning some arbitrary value dependent on the state and address for each read operation. Such an abstraction is sound, but it does not capture all the properties of a memory.

Subsequently, Velev (see, M. N. Velev, "Automatic Abstraction of Memories in the Formal Verification of Superscalar Microprocessors, " Proceeding of Tools and Algorithms for the Construction and Analysis of Systems, 2001, pp. 252-267), automated the process of abstraction of data memory by applying a system of conservative transformation rules and generating hybrid memory model(s) where forwarding semantics of memory is satisfied only for some levels of forwarding.

More recently, Bryant et al., in an articled entitled "Modeling and Verifying Systems using a Logic of Counter Arithmetic with Lambda Expressions and Uninterpreted Functions", that appeared in Computer-Aided Verification in 2002, proposed logic to model infinite-state systems and unbounded memory in a system named UCLID. According to this article, memory is modeled as a function expression whose body can change with time step(s). Similar to that shown by Burch and Dill, the memory is represented symbolically by creating nested if-then-else (ITE) structure to record the history of writes to the memory. In this restricted Counter arithmetic with Lambda Expressions and Uninterpreted Functions (CLU) logic, one can use BMC to verify safety properties.

Despite these advances however, SAT-based BMC is still unable to handle designs involving large embedded memories and therefore, more thorough, efficient, and expedient approaches are required. Such enhancements to SAT-based BMC would represent a significant advance in the art and is therefore the object of the present invention.

Additionally, and according to a Semiconductor Industry Association roadmap prediction, embedded memories will comprise more than 70% of the System on a Chip (SoC) devices by 2005. These embedded memories on SoC support diverse code and data requirements arising from an ever increasing demand for data throughput in applications ranging from cellular phones, smart cards and digital cameras.

Efforts to verify on-chip memory arrays using Symbolic Trajectory Evaluation are fraught with difficulty as embedded memories dramatically increase both design and verification complexity due to an exponential increase in the state space with each additional memory bit. In particular, this state explosion adversely affects the practical application of formal verification techniques like model checking for functional verification of such large embedded memory systems.

To tame the verification complexity, several memory abstraction techniques, i.e., removing the memories partially or completely from the designs are often used in the industry. However, such techniques often produce spurious outcomes, adversely affecting overall verification efforts. In many refinement-based techniques, starting from a small abstract model of the concrete design, spurious counter-examples on the abstract model are used to refine the model iteratively. In practice, several iterations are needed before a property can be proved correct or a real counter-example can be found. Note that after every iterative refinement step, the model size increases, making it increasingly difficult to verify.

In contrast, abstraction-based approaches use proof-based abstraction (PBA) techniques on a concrete design. As shown by the inventors in a paper entitled "Iterative Abstraction using SAT-based BMC with Proof Analysis", which appeared in the Proceedings of International Conference on Computer Aided Design in 2003, iterative abstraction can be used to apply such techniques on progressively more abstract models, thereby leading to significant reduction in model size. However, since these approaches use the concrete model to start with, it may not be feasible to apply them on designs with large memories. In general, both these refinement and abstraction based approaches are not geared towards exploiting the memory semantics.

SUMMARY OF THE INVENTION

We have invented a practical method for abstraction to augment the capability of SAT-based BMC to handle embedded memory designs without explicitly modeling each memory bit. Advantageously, our inventive method does not require examining the design and it will not generate false negatives.

Viewed from a first aspect our inventive method is a computer implemented method, applicable to electronic designs having one or more embedded memories, such that the memory bits comprising the embedded memories need NOT be explicitly modeled, the method comprising the steps of: removing the memories for the design while retaining data forwarding semantics; capturing the data forwarding semantics and memory preservation constraints for preserving an arbitrary initial memory state as efficient memory modeling (EMM) constraints in a suitable representation; and verifying the design using a bounded analysis.

Viewed from another aspect, our inventive method is a computer implemented method, applicable to electronic designs having one or more embedded memories, such that the memory bits comprising the embedded memories are NOT explicitly modeled, wherein the method comprises the steps of: removing one or more of the memories from the design while retaining data forwarding semantics; capturing the data forwarding semantics as efficient memory modeling (EMM) constraints in a suitable representation; adding exclusivity constraints to the representation; and verifying the design using a suitable bounded analysis such that when a valid matching read and write combination is determined, other combinations are immediately implied invalid as a result of the exclusivity constraints.

Further features and advantages of the present invention will become apparent when the following detailed description is read in conjunction with the Drawing in which:

BRIEF DESCRIPTION OF THE DRAWING

FIG. 3 is a pseudocode listing of a DPLL style SAT solver;

FIG. 4 is a pseudocode listing of a SAT-based BMC for Safety Property P;

FIG. 6 is a pseudocode listing of an improved SAT-based BMC with Efficient Memory Modeling;

FIG. 7 is a pseudocode listing of an Efficient Modeling of Memory Constraint;

FIG. 9 is a pseudocode listing of a BMC algorithm with PBA and EMM constraints;

FIG. 10 is a pseudocode listing of a Software Program having embedded stack used in our Examples; and FIG. 11 is a pseudocode listing of a stack implementation using RAM.

DETAILED DESCRIPTION

Overview of our Approach

Figure 1:
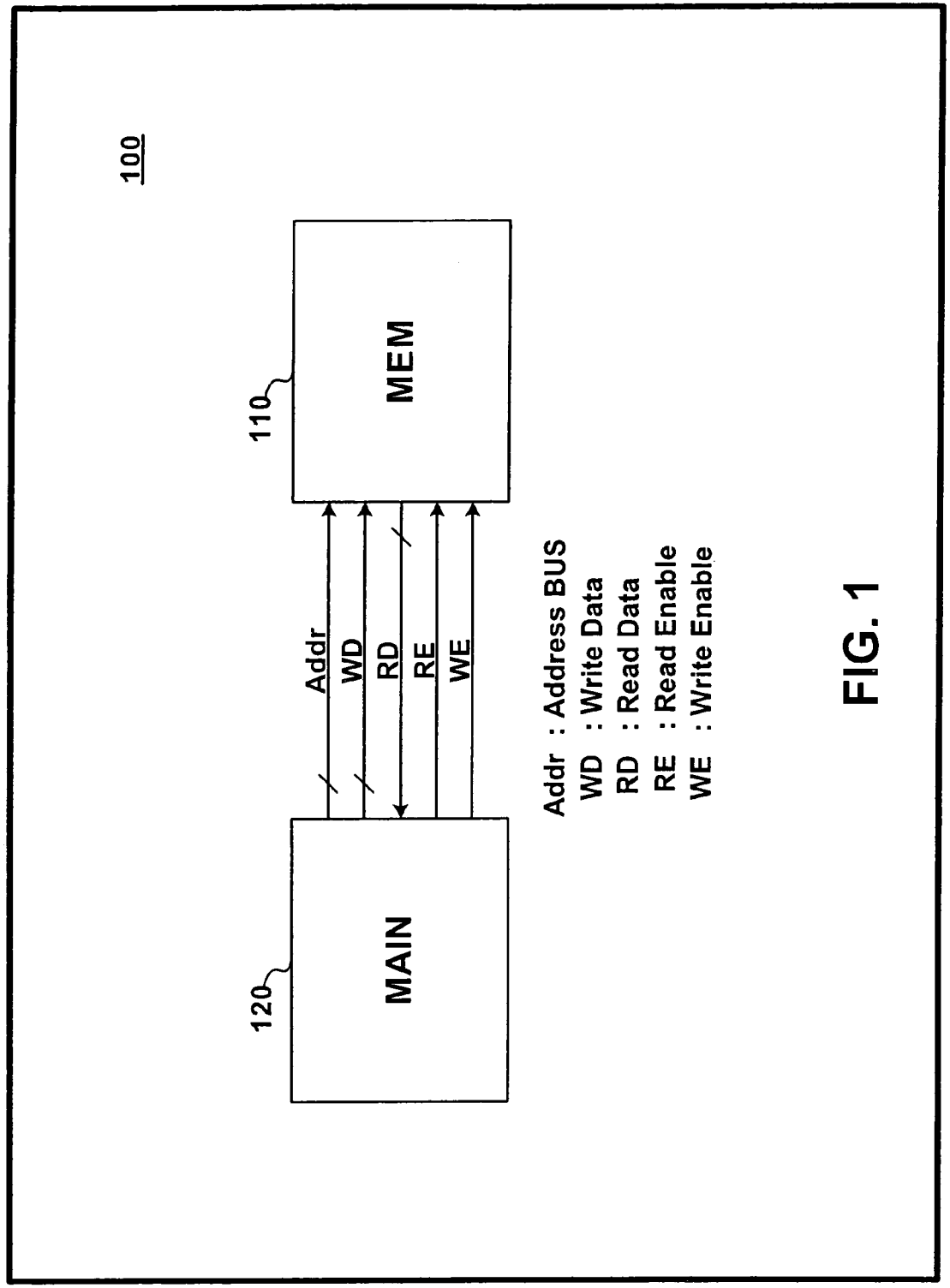
FIG. 1 is a schematic representation of a design having embedded memory.

Our inventive approach may be better understood with reference to FIG. 1, which shows a block diagram of a digital system 100 having embedded memory. For designs such as that shown in FIG. 1, a main module 120 interacts with a memory module 110 through the use of a number of interface signals such as those shown in the figure. For a single port memory at any given clock cycle, the following observations may be made: a) At most one address is valid; b) At most one write occurs; and c) At most one read occurs. For designs having large embedded memories, as BMC-search-bound k becomes larger, unrolled design size increases linearly with the size of memory bits as shown in FIG. 2.

Figure 2:
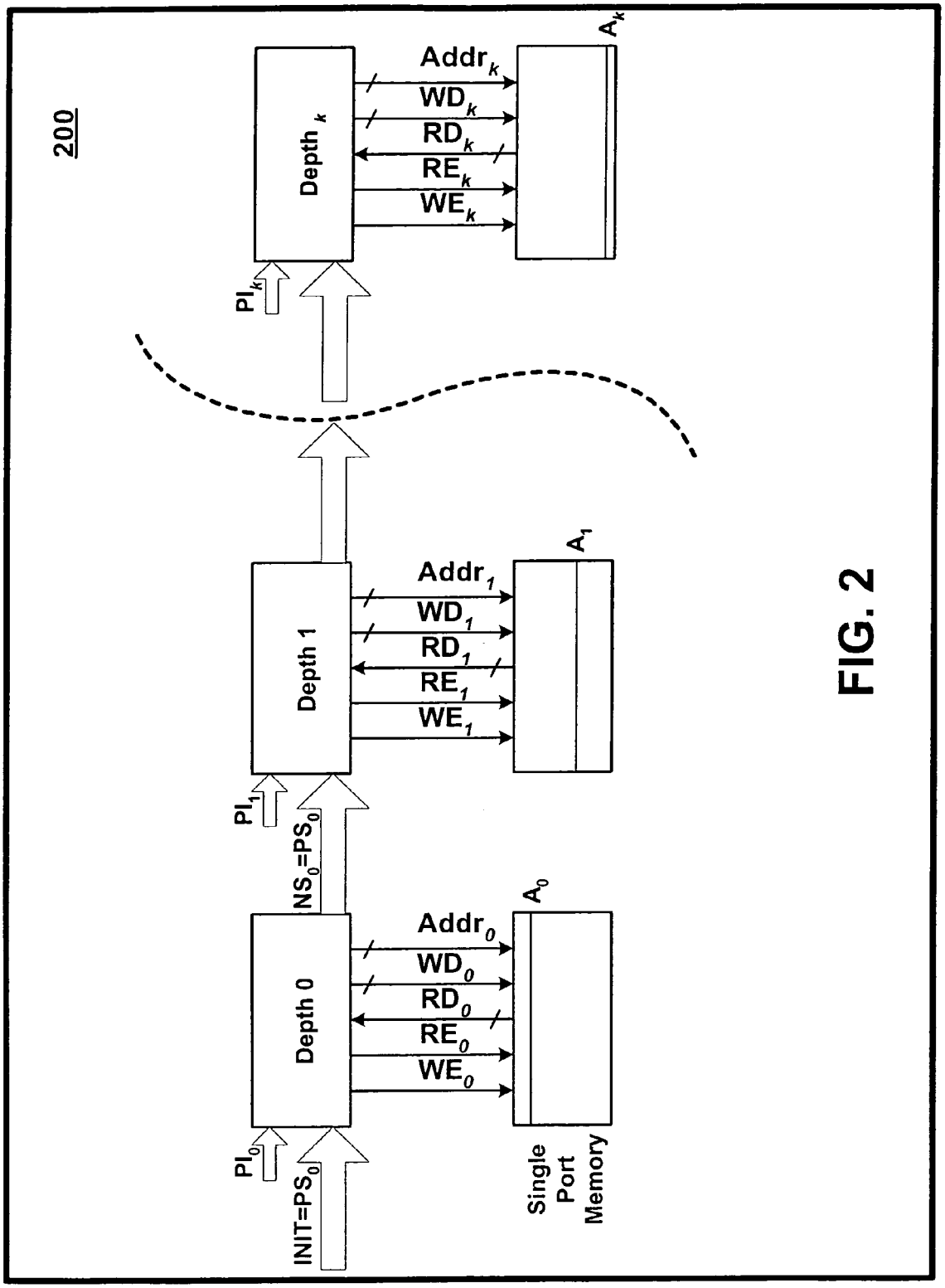
FIG. 2 is a schematic representation of an unrolled design having embedded memory.

With reference now to that FIG. 2, there is shown an "unrolled" design 200 having an embedded memory. Shown specifically in that design 200, are a series of "depths" within a single port memory.

In the above semantics of memory, one can observe that any memory read at a particular depth depends on the most recent data written at the same address, at some previous depth. Therefore, to enable SAT-based BMC analysis deeper on designs such as that shown in FIG. 2, the following steps are performed without analyzing a MAIN module:

a) remove the MEM module but retain the memory interface signals and the input-output directionality with respect to the MAIN module; and b) add constraints at every analysis depth k on the memory interface signals that preserve the forward semantics of the memory.

To make the search of SAT solver more efficient, we add the following step:

c) add constraints such that when the SAT-solver decides on a valid matching read and write combination, other combinations are implied invalid immediately.

Note that while a) and b) above are sufficient to generate an efficient model that preserves the validity of the property, c) results in superior performance of the SAT-based BMC. In order to fully appreciate the improvement, some further discussion on background is necessary.

State-of-the-art-SAT Solver

The Boolean Satisfiability (SAT) problem involves determining a satisfying assignment for a Boolean formula on the constituent Boolean variables or proving that no such assignment exists. The problem is known to be NP-complete and as is readily appreciated by those skilled in the art, contemporary SAT solvers typically employ DPLL style algorithm as shown in FIG. 3. With reference to that FIG. 3, one can readily observe such an algorithm includes three main component engines, namely: decision, deduction, and diagnosis.

A Boolean problem can be expressed either in Conjunctive Normal Form (CNF) or logical gate form (LGF) or both. A hybrid SAT solver where the problem is represented as both logical gates and a CNF expression, is well suited for BMC.

Bounded Model Checking

With Bounded Model Checking (BMC), a specification is expressed in Linear Temporal Logic (LTL). Given a Kripke structure M, an LTL formula f, and a bound n, the translation task in BMC is to construct a propositional formula $[M, f]_n$, such that the formula is satisfiable if and only if there exists a witness of length n. This "satisfiability" check is performed by a backend SAT solver and verification typically proceeds by looking for witnesses or counter-examples (CE) of increasing length until completeness threshold is reached.

The overall algorithm (BMC-1) of a SAT-based BMC for checking (or falsifying) a simple safety property is shown in FIG. 4 (ignoring lines 10-11 for now). Note that $P^i$ denotes the property node at the $i^{th}$ unrolling of the transition relation, I denotes the initial state of the system, and $LFP^i$ denotes that the path of length i is loop-free. In lines 5-7, a SAT solver is used to check the forward and backward termination criteria for correctness. In line 8, a SAT solver is used to check the existence of a counter-example.

Proof-Based Abstraction (PBA)

A PBA technique for SAT-based BMC is shown in lines 10-11 in FIG. 4. In particular, and with reference to that FIG. 4, when the SAT problem at line 8 is unsatisfiable, i.e., there is no counter-example for the safety property at a given depth i, the unsatisfiable core (U_Core) is obtained using the procedure SAT_Get_Refutation in line 10. This procedure simply retraces the resolution-based proof tree used by the SAT solver and identifies a subset formula that is sufficient for unsatisfiability. One can then use either a gate-based abstraction or a latch-based abstraction technique to obtain an abstract model from the U_Core. Here we show a latch-based abstraction technique in line 11, to obtain a set of latch reasons $LR^i$ at depth i.

An abstract model is then generated for depth i by converting those latches in the given design that are not in the set $LR^i$ to pseudo-primary inputs. Due to the sufficiency property of U_Core, the resulting abstract model is guaranteed to preserve correctness of the property up to depth i. Depending on locality of the property, the set $LR^i$ can be significantly smaller than the total latches in the given design. Specifically, a depth d (<n) is chosen such that the size of set $LR^d$ does not increase over a certain number of depths, called stability depth. In many cases, the property can be proved correct on the abstract model generated at depth d and hence, for the given design. One can apply PBA techniques iteratively, called iterative abstraction, to further reduce the set $LR^d$ and hence, obtain a smaller abstract model.

Semantics of Memory

As can be readily appreciated by those skilled in the art, embedded memories are typically used in several forms such as randomly accessible memory (RAM), serially accessible memory (SAM), first-in, first-out (FIFO) and last-in, first-out (i.e., stack) each implemented with at least one port for data access. For our discussion here, we will assume a single port memory as such as that shown in FIG. 1, having the following interface signals: Address Bus (Addr), Write Data Bus (WD), Read Data Bus (RD), Write Enable (WE), and Read Enable (RE).

Figure 5:
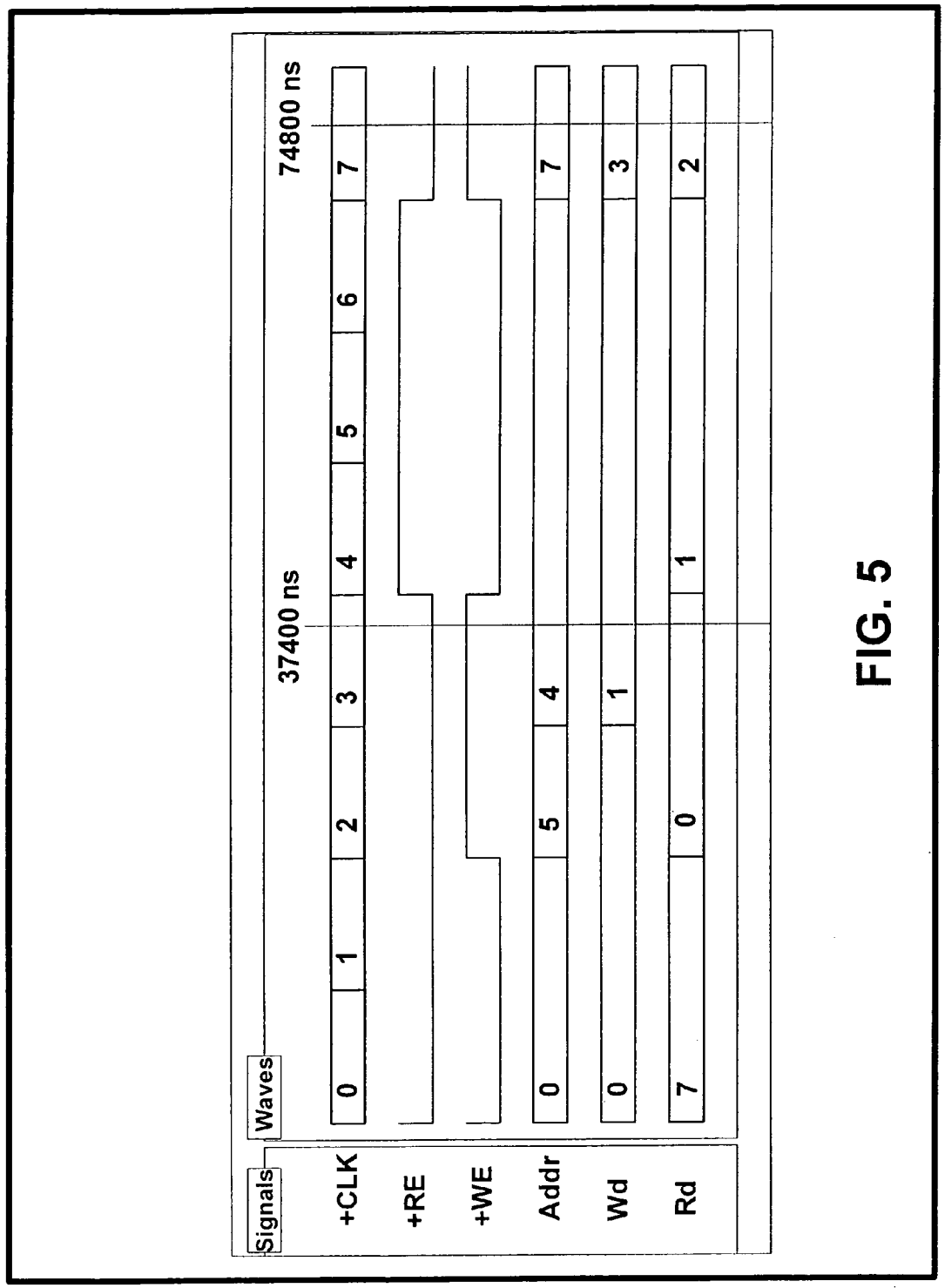
FIG. 5 is a memory access timing diagram.

A timing diagram typical of memory access operations is shown in FIG. 5. With reference now to that FIG. 5, one can observe that the write phase of a memory operation requires two clock cycles. In the first clock cycle, a data value is assigned to WD bus, the write address location is assigned to Addr bus, and WE signal is made active. In the second phase of the clock, the address location of the memory has received the new data.

The read phase of memory operation, on the other hand, requires only one clock cycle. In particular, when a read address location is assigned to Addr bus and the RE is made active, the read data is assigned to RD bus. For example in FIG. 5, data 0 and 1 is written at address location 5 and 4 in clock cycles 2 and 3 respectively. The data is read at clock cycles 4, 5, and 6 from address location 4.

Now, assume we unroll a memory design up to depth k (starting from 0). If we let $S^j$ denote memory interface signal variable S in the time frame j, and let Boolean variable $E^{ij}$ to be defined as $E^{ij}=(Addr^j=Addr^i)$, then the forward semantics of the memory can be expressed as:

$$RD^k = \{WD^j | E^{jk}=1 \char`\^ WE^j=1 \char`\^ RE^k=1 \char`\^ \forall_{j<i<k}(E^{ik}=0 \vee WE^i=0)\} \quad (1)$$

In other words, data read at $k^{th}$ depth equals the data written at the $j^{th}$ depth, if addresses are equal at k and j, write enable is active at j, read enable is active at k, and for all depths between j and k either addresses are different from that of k or no write happened.

Our Approach

According to our inventive teachings, with our approach we augment the SAT-based BMC (as a part of our formal verification platform) with a mechanism to add memory-modeling constraints at every unroll depth of BMC analysis. More specifically, we employ a hybrid SAT solver that uses hybrid representations of Boolean constraints, i.e., 2-input OR/INVERTER gates to represent the original circuit problem and CNF to represent the learned constraints. Advantageously, we extend the use of hybrid representation to model memory constraints efficiently and we specifically compare it with only 2-input uniform gate (instead of multi-input gate) representation as we have determined and shown that efficient Boolean constraint propagation can be achieved using a fast table lookup scheme on such a 2-input uniform gate representation.

Adding the constraints for the forward semantics of memory as in Equation (1), one can use a conventional approach based on the selection operator ITE. Specifically, if we let Boolean variable $s^{jk}$ denote the valid read signal that is defined as $s^{jk}=E^{jk} \char`\^ WE^j$, then the data read at depth k is given by:

$$RD^k = ITE(s^{k-1,k}, WD^{k-1}, ITE(s^{k-2,k}, WD^{k-2}, \ldots ITE(s^{0k}, WD^0, WD^{-1})) \ldots ) \quad (2)$$

where, $WD^{-1}$ denotes the uniform data value I with which all the memory addresses are initialized, and ITE, when applied on three Boolean variable is defined as ITE(s,t,e)=(s & t)|(!s & e). Later, we will briefly describe how to handle cases when the initial memory value is not same at all addresses.

Note that when constraints are added as above, the decision $S^{jk}=1$ does not necessary imply $RD^k=WD^j$, other combinations need to be established invalid through decision procedures as well, i.e., $s^{j+1,k}=0, s^{j+2,k}=0, \ldots, s^{k-1,k}=0$. As such, we add explicit constraints to capture the read and write combination exclusively. More specifically, a matching read and write combination—once chosen by SAT-solver—the other combinations are implied invalid immediately.

For example, if we let the Boolean variable $S^{ik}$ denote the exclusive valid read signal and the Boolean variable $PS^{ik}$ denote the intermediate exclusive signal, they are defined as follows:

$$PS^{ik} = !s^{ik} \wedge PS^{i+1} \forall_{0 \leq i < k} \quad (3)$$
$$= 1 \text{ for } i = k$$
$$S^{ik} = s^{ik} \wedge PS^{i+1k} \forall_{0 \leq i < k}$$
$$= PS^{0k} \text{ for } i = -1$$

Now equation (1) can be expressed as:

$$RD^k = (S^{k-1k} \wedge WD^{k-1})(S^{k-2k} \wedge WD^{k-2}) \ldots (S^{0k} \wedge Wd^0)$$
$$(S^{-1k} \wedge WD^{-1}) \quad (4)$$

Note that $S^{ik}=1$, immediately implies $S^{jk}=0$ where $j \neq i$ and $j < k$.

Efficient Representation of Memory Modeling Constraints

As mentioned before, we advantageously make use of a hybrid representation for building the constraints that succinctly capture equations (3) and (4). Moreover, our hybrid representation provides further efficiencies as follows:

1) It does not create structure where intermediate variable does not fan-out, e.g., OR-tree. Such a circuit structure adversely affects the BCP performance as observed in the context of adding large conflict clauses; and 2) It does not create unnecessary 2-literal clauses that negatively-affect CNF-based SAT-solvers.

With reference to FIG. 6, there is shown a pseudo-code listing of our implementation of our inventive addition of memory modeling constraints, contained within a part of the procedure EMM_Constraints( ). Not specifically shown in that FIG. 7, is that this procedure EMM_Constraints( ) is invoked after every unrolling as shown in the modified BMC algorithm, BMC-2 shown in FIG. 6.

Turning now to FIG. 7, the procedure EMM_Constraints as shown in that FIG. 7, generates memory modeling constraints at every depth k using 3 sub-procedure calls, namely, Gen_Addr_Equal_Sig, Gen_Valid_Read_Sig, and Gen_Read_Data_Constraints. It then returns C—the constraints accumulated so far. As we will see in the following detailed discussion of these sub-procedures, these constraints capture the semantics of the memory safely and very efficiently up to a depth, k.

Gen_Addr_Equal_Sig: Generation of Address Comparison Signals

In this procedure, we let m denote the bit width of address. We then implement the address comparison as follows: for every address pair comparison ($Addr^j = Addr^k$) we introduce new variables $E^{jk}$ and $e^{jk}_i$ such that $\forall_{0 \leq i < m}$. Then we add the following CNF clauses for each i:

$(!E^{jk} + Addr^j_i + !Addr^k_i)$ $(!E^{jk} + !Addr^j_i + Addr^k_i)$ $(e^{jk}_i + Addr^j_i + Addr^k_i)$ $(e^{jk}_i + !Addr^j_i + !Addr^k_i)$ Finally, one clause to connect the relation between $E^{jk}$ and $e^{jk}_i$, is added:

$(!e^{jk}_0 + \ldots + !e^{jk}_i + \ldots + !e^{jk}_{m-1} + E^{jk})$

Note that these clauses capture the relation that $E^{jk}=1$ if and only if ($Addr^j = Addr^k$).

Alternatively, one can use a more conventional method to obtain the similar equivalence relation structurally using AND-tree of X-NOR ( ) gates as follows:

$$E^{jk} = (Addr^j_0 Addr^k_0)^\frown \ldots ^\frown (Addr^j_{m-1} Addrk_{m-1})$$

As can be readily appreciated, this representation would require 4m-12-input OR gates and this amounts to 12m-3 equivalent CNF clauses (3 clauses per gate). Advantageously, our novel representation—in sharp contrast—requires only 4m+1 clauses and does not have 2-literal clauses. At every depth k, we add only (4m+1)k clauses for address comparison as compared to (12m-3)k gates clauses.

Gen_Valid_Read_Sig: Generation of exclusive valid read signals

In representing the exclusive valid read signals as in (3) above, we use a 2-input gate representation instead of CNF clauses. Since each intermediate variable has fan-outs to other signals, we cannot eliminate them completely, however. If we were representing them using CNF clauses, it would introduce a large number of 2-literal clauses that we strive to avoid. This representation adds 3k 2-input gates (or 9k gate clauses) for every depth k.

Gen_Read_Data_Constraints: Generation of constraints on read data signals.

We know by virtue of construction that for a given k, at most one $S^{jk}=1$, $\forall_{-1 \leq j < j}$. We use this fact to represent the constraint in the equation (4) as CNF clauses. Accordingly, we let n denote the bit width of data bus. We then add the following clauses $\forall_{0 \leq i < n}, \forall_{-1 \leq j < k}$ $(!S^{jk} + !RD^k_i + WD^j_i)$ $(!S^{jk} + RD^k_i + !WD^j_i)$ To capture validity of read signal, we add the following clause $(!RE^k + S^{-1k} + \ldots + S^{jk} + \ldots + S^{k-1k})$.

Advantageously this representation adds only $2n(k+1)+1$ clauses at every depth k. On the other hand—and in sharp contrast—if we were to represent it using gates, it would require $n(2k+1)$ gates and therefore, $3n(2k+1)$ gate clauses. Consequently, our hybrid representation adds only $(2n+4m+1)k+2n+1$ clauses and 3k gates at every depth k, as compared with $(4m+2)k+n(2k+1)$ gates added by using the gate representation.

Comparison with ITE Representation

At this point it is useful to compare our inventive hybrid method and representation with the ITE representation. In particular, if we were to use 2-input gates to represent nested ITE representation—at every depth k—we would need (4m-1)k gates for address comparison, k gates for ITE control signals, 3nk gates for implementing ITE operators where total number of ITE operators are nk. Consequently, we need 4mk+3nk gates overall.

In sharp contrast, If we instead use hybrid representation for the nested ITE, at every depth k, we would need (4m+1)k clauses for address comparison, k gates for the ITE control signals, 4nk+1 clauses for implementing the ITE operators. Note that we need to add the following clauses $\forall_{0 \leq i < n}$ $\forall_{0 \leq j < k}$ $(!s^{jk} + !rd^{j+1}_i + WD^j_i);$ $(!s^{jk} + rd^{j+1}_i + !WD^j_i);$ $(s^{jk} + !rd^{j+1}_i + rd^j_i);$ and $(s^{jk} + rd^{j+1}_i + !rd^j_i);$ where $rd^k=RD^k$, and $rd^0=WD^{-1}$. Note further that we have to introduce new intermediate variables $rd^j$ $\forall_{0<j<k}$, and we need to add a clause to capture the validity of the read signal. Overall we utilize $(4m+1+4n)k+1$ clauses and k gates.

With reference to Table 1, we summarize the number of gates and clauses required to represent the constraints in each of the cases A-D as depicted in that Table 1. As can be readily appreciated by those skilled in the art, the number of constraint clauses grows quadratically [emphasis supplied] with the increasing analysis depth k.

TABLE 1

Comparison of # clauses and gates required

| Modeling Styles | Nested ITE | | Exclusive selection criterion | |
|---|---|---|---|---|
| | Gate (A) | Hybrid (B) | Gate (C) | Hybrid (D) |
| #Gates | (4m + 3n)k | k | (4m + 2 + 2n)k + n | 3k |
| #Clause | 0 | (4m + 4n)k + 1 | 0 | (2n + 4m + 1)k + 1 + 2n |

Figure 8:
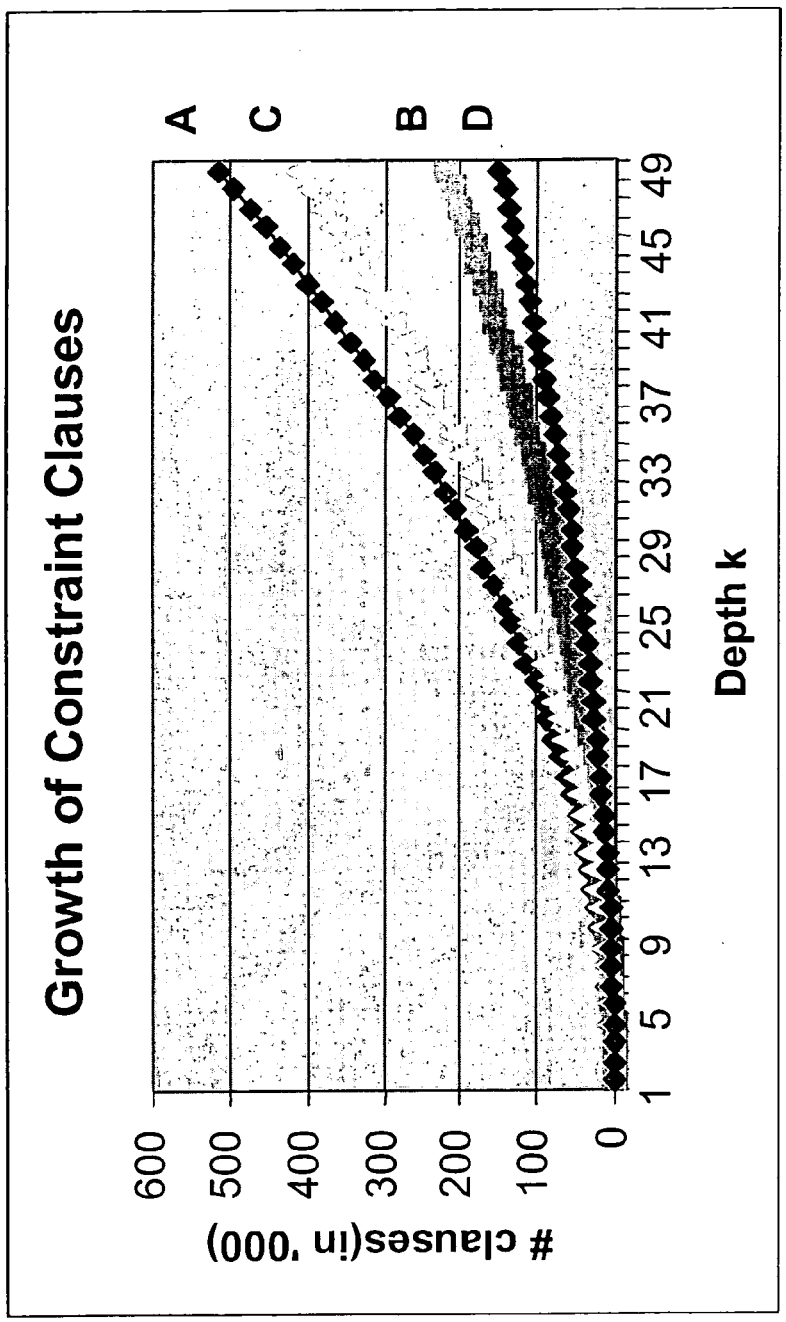
FIG. 8 is a graph showing a comparison of growth of constraint clauses.

For a meaningful comparison between different cases A-D, we use 3 equivalent CNF clauses for each 2-input gate. The growth curve of constraint clauses are shown in FIG. 8 for n=32, m=12. With reference now to that FIG. 8, we see that our inventive hybrid representation D is 3 times more succinct than the gate representation of nested ITE (A) and 50% when compared with hybrid representation of nested ITE (B) at k=50. In other words, BMC would be able to do deeper search using D representation on a limited memory machine when compared with A-C representation. Furthermore, as our inventive representation captures exclusivity of valid read signals explicitly, SAT-solver is able to perform a much faster search as observed in our experiments.

EMM for Multiple Memories, Read, and Write Ports

Before we delve into a discussion of efficient modeling, we first define memory semantics in the presence of multiple read and write ports. We assume there are no data races. In other words, a memory location can be updated at any given cycle through only one write port. (We can easily extend our approach to check for data races.) Since each memory module is accessed only through its ports, the memory modules can be considered independent of each other. In our following discussion, we first consider a single memory with multiple read and multiple write ports.

Let the design be unrolled up to depth k (starting from 0). Let $X^{j,p}$ denote a memory interface signal variable X at time frame j for a port p. Let R and W be the number of read and write ports, respectively, for the given memory. Let the Boolean variable $E^{j,i,w,r}$ denote the address comparison of the read port r at depth i, and the write port w at depth j, defined as $E^{j,i,w,r}=(Addr^{i,r}=Addr^{j,w})$. Then the forwarding semantics of the memory can be expressed as:

$$\left( \begin{array}{c} E^{j,k,w,r} \wedge WE^{j,w} \wedge RE^{k,r} \wedge \forall_{0 \leq p < W} \forall_{j < i < k} \\ (\neg E^{i,k,p,r} \vee \neg WE^{i,p}) \end{array} \right) \rightarrow (RD^{k,r} = WD^{j,w}) \quad (3)$$

In other words, data read at depth k through read port r, equals the data written at depth j through write port w, if the addresses are equal at depth k and j, write enable is active at j for the write port w, read enable is active at k for the read port r, and for all depths strictly between j and k, no data was written at the address location $Addr^{k,r}$ through any write port.

Let the Boolean variable $s^{j,k,w,r}$ be defined as $s^{j,k,w,r}=E^{j,k,w,r} \wedge WE^{j,w}$. The decision $s^{i,k,w,r}=1$ does not necessarily imply $RD^{k,r}=WD^{i,w}$; other pairs need to be established invalid through the decision procedure as well, i.e., $s^{i,k,w+1,r}=0, \ldots, s^{i,k,W-1,r}=0, s^{i+1,k,0,r}=0, \ldots, s^{i+1,k,W-1,r}=0, \ldots, s^{k-1,k,0,r}=0, \ldots, s^{k-1,k,W-1,r}=0$. Similar to the single read/write port approach, we add explicit constraints to capture the exclusivity of the matching read-write pair, in order to improve the SAT solve time. Let the Boolean variables $S^{i,k,w,r}$ and $PS^{i,k,w,r}$ denote the exclusive valid read signal and intermediate signal respectively for a given read port r and write port w. They are defined recursively as follows:

$$PS^{k,k,0,r}=RE^{k,r}$$

$$\forall_{0 \leq i < k} \forall_{0 \leq p < W} PS^{i,k,p,r}=!s^{i,k,p,r} PS^{i,k,p+1,r}$$
$$(PS^{i,k,W,r}=PS^{i+1,k,0,r})$$

$$\forall_{0 \leq i < k} \forall_{0 \leq p < W} S^{i,k,p,r}=s^{i,k,p,r} PS^{i,k,p+1,r} \quad (4)$$

Now the forwarding semantics for multiple read and write ports can be expressed as $$RD^{k,r}=(_{0 \leq p < W, 0 \leq i < k} S^{i,k,p,r} \wedge WD^{i,p})(PS^{0,k,0,r} \wedge WD^{-1}) \quad (5)$$

Note that $S^{i,k,p,r}=1$, immediately implies $S^{j,k,q,r}=0$ where either $q \neq p$ or $j \neq i$, and i,j<k. Advantageously, we use a hybrid representation to add the memory modeling constraints as part of the procedure EMM_Constraints, which is invoked after every unrolling as shown in FIG. 2. Given DW=n and AW=m, we give the sizes of EMM constraints added in terms of clauses and gates for each read port at a given depth k.

1. Address comparison: We require $(4 \cdot m+1) \cdot k \cdot W$ CNF clauses to represent address comparison signals.
2. Exclusive constraints: We require $3 \cdot k \cdot W$ 2-input gates to represent the exclusivity constraints in equation (4).
3. Read data constraints: We require $2 \cdot n \cdot k \cdot W+2 \cdot n+1$ CNF clauses to represent read data constraints in equation (5).

In total, we need $(4 \cdot m+2 \cdot n+1) \cdot k \cdot W+2 \cdot n+1$ clauses and $3 \cdot k \cdot W$ gates for a single read port and W write ports. For R read ports, we would need $((4 \cdot m+2 \cdot n+1) \cdot k \cdot W+2 \cdot n+1) \cdot R$ clauses and $3 \cdot k \cdot W \cdot R$ gates. Note, the growth of constraints remain quadratic with analysis depth k and is W·R times the constraints required for a single memory having a single read/write port. In the presence of multiple memories, we add these EMM constraints for each of them.

Non-Uniform Initialization of Memory

Typically, memories are initialized uniformly. In other words, they are set at some identical initial value at all memory location on power-on reset. However, in a semi-formal verification approaches where BMC can be applied at any state other than power-on reset state, memory may not have uniform value. Handling such non-uniform initial values can be easily done with in our proposed framework.

By way of example, assume that the memory contains p different initial values, i.e., $I^0, \ldots, I^{p-1}$ stored at address location $Addr^0, \ldots, Addr^{p-1}$ for the given initial state of the design. Note that it is not important how we got to that memory state—so long as we can demonstrate that there exists at least one write sequence to get to that state.

As can be appreciated, such a write sequence can be constructed as follows: at t=-p all the memory location is initialized with $I^0$; then $\forall_{1 \leq i \leq p-1}$ a write cycle was issued at t=-p+i for writing data value $I^i$ at address location $Addr^i$. We then need to add p-1 more terms to equation (4) to capture these writes cycles.

We illustrate this for p=2. Assume, that upper half location of the memory array, i.e., $Addr_{m-1}=1$ (MSB) has initial value 2 and the lower half address location, i.e., $Addr_{m-1}=0$ has initial value 1. We construct a write sequence as follows: at t=-2, all address location have value 1, i.e., $WD^{-2}=1$, $WE^{-1}=1$; and at t=-1, value 2 was written, i.e., $Addr^{-1}_{m-1}=1$, $WD^{-1}=2$, $WE^{-1}=1$. Now we need to add one more term in equation (4), i.e., $S^{-2k} \wedge WD^{-2}$.

Arbitrary Initial Memory State

To model a memory with an arbitrary initial state, we introduce new symbolic variables at every time frame. Observe that for a (k-1)-depth analysis of a design, there can be at most k different memory read accesses from a single read port; out of which at most k accesses can be to un-written memory locations. Therefore, in total we need to introduce k symbolic variables for the different data words for each read port at analysis depth k-1. However, these variables are not entirely independent. Simply introducing new variables introduces additional behaviors in the verification model. Therefore, we need to identify a sufficient set of constraints that models the arbitrary initial state of the memory correctly.

Let $V^{i,p}$ and $V^{j,q}$ represent new data words introduced at depths i and j, for read ports p and q, respectively. Let $RA^{i,p}$ and $RA^{j,q}$ be the corresponding read addresses for the ports p and q (p and q need not be distinct). Let $N^{i,p}$ (and $N^{j,q}$) denote the condition that no write has occurred until depth i (and j) at address location $RA^{i,p}$ (and $RA^{j,q}$) We can then express the data read from the ports p and q at depths i and j, respectively, as:

$$N^{i,p} \rightarrow (RD^{i,p}=V^{i,p}), N^{j,q} \rightarrow (RD^{j,q}=V^{j,q})$$

Note that, if read addresses $RA^{i,p}$ and $RA^{j,q}$ are equal, then $V^{i,p}$ and $V^{j,q}$ should also be equal. We add the following constraint to capture the same, $$(RA^{i,p}=RA^{j,q} \wedge N^{i,p} \wedge N^{j,q}) \rightarrow (V^{i,p}=V^{j,q}) \quad (6)$$

For R read ports at (k-1)-depth analysis, we need to add k·R·(R-1) such constraints. We add these constraints using a hybrid representation in a separate sub-procedure call within the procedure EMM_constraints. Note that the proof step in BMC-1, (line 6, FIG. 1) requires correct modeling of the arbitrary initial state of the memory. Using the new set of memory constraints as in equation (6), we augment the proof steps of BMC with EMM constraints. The modified algorithm (BMC-3) is shown in FIG. xx3xx ((NOTE TO SELF This figure needs to be inserted and numbered correctly ))(ignore lines 11-12 for now). Later, we will show that the correctness of safety properties can not be shown without adding these constraints.

EMM With Proof Based Abstraction

As discussed earlier, EMM can significantly reduce the size of the verification model for a SoC having multiple memories and multiple ports. However, for checking the correctness of a given safety property, we may not require all the memory modules or the ports. To further reduce the model, we can abstract out irrelevant memory modules or ports completely. In this case, we do not need to add the memory modeling constraints for the irrelevant memory modules or ports, thereby further reducing the BMC complexity.

For the purpose of automatically identifying irrelevant memory modules and ports, we propose a technique combining EMM constraints with PBA. This can not only reduce the non-memory logic (from the Main module) but also identify the memory modules and ports that are not required for proving correctness up to a given bounded depth of BMC analysis. The overall BMC algorithm with PBA and EMM constraints (BMC-3) is shown in lines 11-12 of FIG. 9

The dependency of the property on any memory module for a given depth i is determined easily by checking whether a latch corresponding to the control logic for that memory module (the logic driving the memory interface signals) is in the set $LR^i$. If no such latch exists in the set $LR^i$, we do not add the EMM modeling constraints for that memory module. In other words, we abstract out that memory module completely. We perform similar abstraction for each memory port. This reduces the problem size and improves the performance, as observed in our experiments reported in the next section.

Case Study

Turning our attention now to FIG. 10, we may now explain our inventive approach using a typical implementation (in Verilog HDL) of a stack using random access memories (RAM) as shown in FIG. 11. For ease of understanding, we use the same notation of memory interface signals as discussed earlier. With specific reference to that FIG. 11, it may be observed that lines 6-18 show the implementation of RAM and lines 22-41 show the implementation of stack. Note that if we were to model the memory explicitly, we would require 130K state bits. Clearly, such modeling will make a SAT-based BMC impractical. For handling recursive programs one would however, need a finitely large stack of the same order.

According to our inventive approach, we first remove the lines 6-18 and line 40 and declare all the memory interface signals as input and output with respect to the stack. Then, we run improved BMC-2 algorithm—as shown in FIG. 6—on the resulting abstracted stack. In the next section, we will discuss our experimental results on several software and hardware designs.

Experiments

For our experimentation, we used four (4), well-known, recursive software programs which are shown in FIG. 10, on one design having an embedded stack and on one design having embedded RAM. In each of these designs, we chose a safety property that makes the modeling of the entire memory imperative, i.e., we simply cannot completely remove the memory from the design. Additionally, we translated each of the software programs into an equivalent hardware model using Verilog HDL using a stack model as discussed along with FIG. 11. For each of the software designs, we now present a short description and the property chosen.

Fibonacci (fib,fib-c)

A Fibonacci function having a recursive implementation is shown in lines 3-7 of FIG. 10. An optimized implementation of the same program using cache is shown in lines 10-19. For a given value of n, these functions return the corresponding Fibonacci number. To generate a non-trivial state space search problem, we use inverse function to describe the negated safety property, i.e., given a certain value of Fibonacci number, does there exist a corresponding n?

3n+1(3nPlus1)

This is the well-known, yet unsolved 3n+1 problem. The software representation is presented in lines 24-31 of FIG. 10. For a given value of n, global variable period keeps number of recursive calls required for program to terminate. To generate a non-trivial state space search problem, we use inverse function to describe the negated safety property, i.e., given a certain value of period does there exist a value of n?

Tower-of-Hanoi (TOH)

The Tower-of-Hanoi algorithm is shown in lines 35-40 of FIG. 10. Given the number of stacking elements n, the recursive algorithm finds the legal moves to transfer all elements from source s to destination d using auxiliary a. The global variable count keeps the number of moves required. As above, to generate a non-trivial state space search problem, we use inverse function to describe the negated safety property, i.e., given a certain value of count does there exist a corresponding n?

Our experiments were conducted on a workstation having dual Intel 2.8 GHz Xeon Processors with 4 Gb physical memory running Red Hat Linux 7.2 using 3 hours time limit on each BMC run. We compare the performance of augmented SAT-based BMC for handling embedded memory with explicit memory modeling and other styles. We also compare their performances with increasing memory sizes for a given property and design.

We performed our first set of experiments on the hardware models of the software programs having several properties selected as described above. Each of the properties has non-trivial witness and is listed in the Tables 2-5 in the order of increased search complexity. We used fixed memory size in each model. We also used one industrial hardware design with a safety property that is supposed to not have a counter-example. For these properties, we show the performance and memory utilization comparison of the memory modeling styles, i.e., explicit memory modeling, memory modeling using hybrid exclusive selection criteria D, and memory modeling using hybrid nested ITE B in the Tables 2-5.

With simultaneous reference now to Table 2a and Table 2b, there we show the comparison result for Fibonacci model (Table 2a) and the result for its optimized implementation (Table 2b). Note that we have used address width AW=12 and data width DW=32 for these models.

TABLE 2a

Comparison of memory modeling on Fibonacci model. AW = 12, DW = 32

| | | Performance | | | | | Memory Utilization | | | | |
|---|---|---|---|---|---|---|---|---|---|---|---|
| Prp | Wit Depth | Explicit P1(sec) | ITE P2(sec) | Sel P3(sec) | Speed = P1/P3 | Speed = P2/P3 | Explicit M1(Mb) | ITE M2(Mb) | Sel M3(Mb) | Save = M3/M1 | Save = M3/M2 |
| D2 | 39 | 2423 | 20 | 19 | 126 | 1.0 | 2252 | 21 | 18 | 0.01 | 0.2 |
| D3 | 66 | NA | 223 | 150 | NA | 1.5 | MO | 115 | 80 | NA | 0.5 |
| D4 | 111 | NA | 703 | 477 | NA | 1.5 | MO | 170 | 121 | NA | 0.3 |
| D5 | 183 | NA | 3471 | 2663 | NA | 1.3 | MO | 379 | 342 | NA | 0.5 |
| Avg | | | | | 126 | 1.3 | | | | 0.01 | 0.4 |

TABLE 2b

Comparison of memory modeling on Opt. Fibonacci model. AW = 12, DW = 32

| | | Performance | | | | | Memory Utilization | | | | |
|---|---|---|---|---|---|---|---|---|---|---|---|
| Prp | Wit Depth | Explicit P1(sec) | ITE P2(sec) | Sel P3(sec) | Speed == P1/P3 | Speed == P2/P3 | Explicit M1(Mb) | ITE M2(Mb) | Sel M3(Mb) | Save = M3/M1 | Save = M3/M2 |
| D0 | 14 | 179 | 1 | 1 | 146 | 1.1 | 517 | 7 | 6 | 0.01 | 0.86 |
| D1 | 25 | 1050 | 5 | 4 | 248 | 1.3 | 1411 | 12 | 10 | 0.01 | 0.83 |
| D2 | 38 | 2835 | 20 | 15 | 184 | 1.3 | 2239 | 22 | 17 | 0.01 | 0.77 |
| D3 | 51 | NA | 79 | 47 | NA | 1.7 | MO | 41 | 34 | NA | 0.83 |
| D4 | 64 | NA | 125 | 100 | NA | 1.3 | MO | 63 | 52 | NA | 0.83 |
| D5 | 77 | NA | 252 | 311 | NA | 0.8 | MO | 100 | 75 | NA | 0.75 |
| D6 | 90 | NA | 587 | 362 | NA | 1.6 | MO | 175 | 92 | NA | 0.53 |
| D7 | 103 | NA | 625 | 557 | NA | 1.1 | MO | 163 | 161 | NA | 0.99 |
| D8 | 116 | NA | 1060 | 674 | NA | 1.6 | MO | 189 | 187 | NA | 0.99 |
| D9 | 129 | NA | 1674 | 1359 | NA | 1.2 | MO | 343 | 204 | NA | 0.59 |
| D10 | 142 | NA | 3782 | 2165 | NA | 1.7 | MO | 353 | 372 | NA | 1.05 |
| D11 | 155 | NA | 2980 | 2043 | NA | 1.5 | MO | 421 | 303 | NA | 0.72 |
| D12 | 168 | NA | 4349 | 4517 | NA | 1.0 | MO | 319 | 623 | NA | 1.95 |
| D13 | 181 | NA | 5573 | 4010 | NA | 1.4 | MO | 485 | 335 | NA | 0.69 |
| D14 | 194 | NA | 6973 | 4889 | NA | 1.4 | MO | 558 | 531 | NA | 0.95 |
| D15 | 207 | NA | >3 hr | 7330 | NA | NA | MO | 541 | 461 | NA | 0.85 |
| Avg | | | | | 193 | 1.3 | | | | 0.01 | 0.9 |

TABLE 3

Comparison of memory modeling on 3n + 1 model. AW = 12, DW = 2

| | | Performance | | | | | Memory Utilization | | | | |
|---|---|---|---|---|---|---|---|---|---|---|---|
| Prp | Wit Depth | Explicit P1(sec) | ITE P2(sec) | Sel P3(sec) | Speed = P1/P3 | Speed = P2/P3 | Explicit M1(Mb) | ITE M2(Mb) | Sel M3(Mb) | Save = M3/M1 | Save = M3/M2 |
| D4 | 14 | 3 | 0 | 1 | 5 | 0.9 | 29 | 4 | 4 | 0.14 | 1.00 |
| D5 | 17 | 17 | 1 | 1 | 15 | 0.8 | 50 | 5 | 5 | 0.10 | 1.00 |
| D6 | 20 | 55 | 3 | 3 | 19 | 0.9 | 69 | 6 | 6 | 0.09 | 1.00 |
| D7 | 23 | 114 | 4 | 5 | 23 | 0.8 | 93 | 7 | 7 | 0.08 | 1.00 |
| D8 | 26 | 274 | 8 | 8 | 33 | 1.0 | 111 | 9 | 9 | 0.08 | 1.00 |
| D9 | 29 | 277 | 12 | 13 | 21 | 0.9 | 122 | 11 | 11 | 0.09 | 1.00 |
| D10 | 32 | 962 | 13 | 18 | 52 | 0.7 | 242 | 11 | 14 | 0.06 | 1.27 |
| D11 | 35 | 1376 | 31 | 34 | 41 | 0.9 | 195 | 20 | 18 | 0.09 | 0.90 |
| D12 | 38 | 1182 | 55 | 30 | 39 | 1.8 | 277 | 24 | 15 | 0.05 | 0.63 |
| D13 | 41 | 2966 | 71 | 83 | 36 | 0.8 | 294 | 22 | 25 | 0.09 | 1.14 |
| D14 | 44 | 2760 | 81 | 66 | 42 | 1.2 | 293 | 27 | 23 | 0.08 | 0.85 |
| D15 | 47 | 3837 | 109 | 138 | 28 | 0.8 | 314 | 30 | 37 | 0.12 | 1.23 |
| D16 | 50 | 2811 | 167 | 160 | 18 | 1.0 | 412 | 44 | 37 | 0.09 | 0.84 |
| D17 | 53 | 3236 | 205 | 207 | 16 | 1.0 | 407 | 42 | 58 | 0.14 | 1.38 |
| D18 | 56 | 5643 | 258 | 264 | 21 | 1.0 | 569 | 48 | 44 | 0.08 | 0.92 |
| D19 | 59 | 4518 | 312 | 277 | 16 | 1.1 | 432 | 56 | 49 | 0.11 | 0.88 |
| D20 | 62 | 9078 | 324 | 368 | 25 | 0.9 | 479 | 58 | 59 | 0.12 | 1.02 |
| D21 | 65 | 9613 | 426 | 483 | 20 | 0.9 | 585 | 72 | 85 | 0.15 | 1.18 |
| D22 | 68 | 10446 | 487 | 522 | 20 | 0.9 | 648 | 73 | 64 | 0.10 | 0.88 |
| D23 | 71 | 9903 | 562 | 590 | 17 | 1.0 | 668 | 82 | 74 | 0.11 | 0.90 |
| D24 | 74 | >3 hr | 674 | 692 | NA | 1.0 | 981 | 83 | 92 | NA | 1.11 |
| D25 | 77 | >3 hr | 910 | 746 | NA | 1.2 | 719 | 110 | 83 | NA | 0.75 |
| D26 | 80 | >3 hr | 820 | 861 | NA | 1.0 | 875 | 106 | 89 | NA | 0.84 |
| D27 | 83 | >3 hr | 969 | 990 | NA | 1.0 | 586 | 113 | 80 | NA | 0.71 |
| D28 | 89 | >3 hr | 1292 | 1201 | NA | 1.1 | 659 | 127 | 113 | NA | 0.89 |
| D29 | 92 | >3 hr | 1439 | 1426 | NA | 1.0 | 549 | 165 | 125 | NA | 0.76 |
| D30 | 98 | >3 hr | 1710 | 1705 | NA | 1.0 | 687 | 168 | 166 | NA | 0.99 |
| D31 | 101 | >3 hr | 1908 | 1763 | NA | 1.1 | 750 | 195 | 165 | NA | 0.85 |
| D32 | 104 | >3 hr | 2086 | 2058 | NA | 1.0 | 616 | 197 | 167 | NA | 0.85 |
| D33 | 107 | >3 hr | 2246 | 2246 | NA | 1.0 | 654 | 185 | 177 | NA | 0.96 |
| D34 | 116 | >3 hr | 2961 | 2886 | NA | 1.0 | 1142 | 197 | 170 | NA | 0.86 |
| Avg | | | | | 25 | 1.0 | | | | 0.1 | 0.99 |

In Table 3, we show the comparison result for 3n+1 model. Therein, we used AW=12 and DW=2. In Table 4, therein we show the comparison result for Tower-of-Hanoi model. For that mode, we used AW=12 and DW=22. Finally, in Table 5, we compare the results for the industrial hardware design with given safety property S for various intermediate analysis depths as the property was not violated within the resource limit. The model has AW=12 and DW=12.

TABLE 4

Comparison of memory modeling on Tower-of-Hanoi. AW = 12, DW = 22

| | | Performance | | | | | Memory Utilization | | | | |
|---|---|---|---|---|---|---|---|---|---|---|---|
| Prp | Wit Depth | Explicit P1(sec) | ITE P2(sec) | Sel P3(sec) | Speed = P1/P3 | Speed = P2/P3 | Explicit M1(Mb) | ITE M2(Mb) | Sel M3(Mb) | Save = M3/M1 | Save = M3/M2 |
| D1 | 10 | 4 | 0 | 0 | 149 | 1.3 | 71 | 3 | 3 | 0.04 | 1.00 |
| D2 | 24 | 182 | 1 | 1 | 264 | 1.2 | 664 | 6 | 5 | 0.01 | 0.83 |
| D3 | 52 | 2587 | 13 | 10 | 255 | 1.2 | 2059 | 16 | 12 | 0.01 | 0.75 |
| D4 | 108 | NA | 229 | 129 | NA | 1.8 | MO | 68 | 43 | NA | 0.63 |
| D5 | 220 | NA | 1266 | 838 | NA | 1.5 | MO | 214 | 143 | NA | 0.67 |
| D6 | 444 | NA | 8232 | 6925 | NA | 1.2 | MO | 845 | 569 | NA | 0.67 |
| Avg | | | | | 223 | 1.4 | | | | 0.02 | 0.8 |

TABLE 5

Comparison of memory modeling on industrial hardware design. AW = 12, DW = 12

| | | Performance | | | | | Memory Utilization | | | | |
|---|---|---|---|---|---|---|---|---|---|---|---|
| Prp | Analysis Depth | Explicit P1(sec) | ITE P2(sec) | Sel P3(sec) | Speed = P1/P3 | Speed = P2/P3 | Explicit M1(Mb) | ITE M2(Mb) | Sel M3(Mb) | Save = M3/M1 | Save = M3/M2 |
| S | 68 | 10680 | 1264 | 925 | 11 | 1.3 | 2049 | 91 | 64 | 0.03 | 0.7 |
| | 150 | NA | 9218 | 7140 | NA | 1.3 | MO | 770 | 261 | NA | 0.3 |
| | 178 | NA | >3 hr | 10272 | NA | NA | MO | NA | 908 | NA | NA |

With respect to all of the Tables 2-5, the $1^{st}$ Column shows the properties of increasing complexity, the $2^{nd}$ Column shows the witness depth (shows the intermediate analysis depth in Table 5), the $3^{rd}$-$7^{th}$ Columns show the performance figures and $8^{th}$-$12^{th}$ Columns show memory utilization figures.

In second set of experiments, we used different memory sizes for the property D14 and the model 3n+1. In addition, we varied the address bus width AW from 4 to 14 bits and compared the performance and memory utilization of the three approaches as shown in the $2^{nd}$ Column of Table 6. The remaining Columns of Table 6 provide the same information as that provided in Tables 2-5.

TABLE 6

Comparison of memory modeling with varying address width. DW = 12

| | | Performance | | | | | Memory Utilization | | | | |
|---|---|---|---|---|---|---|---|---|---|---|---|
| Prp | AW | Explicit P1(sec) | ITE P2(sec) | Sel P3(sec) | Speed = P1/P3 | Speed = P2/P3 | Explicit M1(Mb) | ITE M2(Mb) | Sel M3(Mb) | Save = M3/M1 | Save = M3/M2 |
| P44 | 4 | 64 | 85 | 60 | 1.1 | 1.4 | 23 | 22 | 20 | 0.87 | 0.9 |
| | 5 | 81 | 72 | 47 | 1.7 | 1.5 | 21 | 22 | 17 | 0.81 | 0.8 |
| | 6 | 110 | 77 | 79 | 1.4 | 1.0 | 25 | 23 | 24 | 0.96 | 1.0 |
| | 7 | 117 | 99 | 53 | 2.2 | 1.9 | 28 | 25 | 19 | 0.68 | 0.8 |
| | 8 | 146 | 87 | 78 | 1.9 | 1.1 | 41 | 24 | 24 | 0.59 | 1.0 |
| | 9 | 265 | 79 | 73 | 3.6 | 1.1 | 49 | 25 | 22 | 0.45 | 0.9 |
| | 10 | 767 | 86 | 59 | 12.9 | 1.4 | 95 | 27 | 22 | 0.23 | 0.8 |
| | 11 | 1490 | 89 | 56 | 26.4 | 1.6 | 153 | 27 | 20 | 0.13 | 0.7 |
| | 12 | 2736 | 85 | 51 | 54.1 | 1.7 | 293 | 25 | 20 | 0.07 | 0.8 |
| | 13 | 3759 | 83 | 54 | 69.6 | 1.5 | 569 | 24 | 21 | 0.04 | 0.9 |
| | 14 | 11583 | 81 | 46 | 249.2 | 1.7 | 1452 | 25 | 18 | 0.01 | 0.7 |
| Avg | | | | | 38 | 1.5 | | | | 0.4 | 0.8 |

More specifically the performance columns—the $3^{rd}$-$5^{th}$—Columns—show the BMC search time taken (in sec) for explicit memory modeling (P1), using nested ITE (P2), and using exclusive select criteria (P3) respectively. The $6^{th}$-$7^{th}$ Columns show the speed up (ratio) using exclusive select criteria over the explicit memory modeling and the nested ITE respectively. Memory utilization columns, —the $8^{th}$-$10^{th}$ Columns—show the memory used (in Mb) by explicit memory modeling (M1), using nested ITE (M2), and using exclusive select criteria (M3) respectively. Finally, the $1^{th}$-$12^{th}$ Columns show the memory usage reduction (ratio) using exclusive select criteria over the explicit memory modeling and the nested ITE respectively.

Observing the performance figures in the $6^{th}$ Column of Tables 2-5, we see that our approach increases the performance of the BMC by 1-2 order of magnitude when compared to explicit memory modeling. Similarly, as shown in the $11^{th}$ Column of these tables, there is reduction in memory utilization by 1-2 order of magnitude between the two approaches. Moreover, our modeling style of using exclusive selection criteria is better than nested ITE as shown in the $7^{th}$ and $12^{th}$ Columns. Advantageously, we see an average performance improvement of 30-40% and a reduction in memory utilization of 20-30% with noticeably more at higher analysis depth. Noticeably, in the last row of Table 2b and 5, nested ITE times out while our approach completes the analysis with in the time limit.

As shown in the $6^{th}$ and $10^{th}$ Columns, the performance improvement and memory usage reduction gets more pronounced—by about 2 orders of magnitude—with increased memory size. Moreover, our approach show on average 50% performance improvement and 20% memory usage reduction over nested ITE!

Additional Experiments

We have implemented the proposed EMM techniques in a prototype verification platform, which includes standard verification techniques for SAT-based BMC and BDD-based model checking. We report our experiences on several case studies consisting of large industry designs and software programs that have embedded memory modules with multiple read and write ports. Two case studies correspond to industry designs with many reachability properties. Another case study involves a sorting algorithm with properties validating the algorithm. For each of the properties, we require modeling of the embedded memory, and the case studies were chosen to highlight the use of our different contributions. We compare our approach (labeled EMM), with explicit memory modeling (labeled Explicit Modeling) to show the effectiveness of our approach. We experimented on a workstation with 2.8 GHz Xeon processors with 4 GB running Red Hat Linux 7.2.

Case Study on Quick Sort: This case study makes use of EMM for multiple memories, EMM that models arbitrary initial state, and EMM with PBA to identify irrelevant memory modules. We implemented a quick sort algorithm using Verilog HDL (Hardware Description Language). The algorithm is recursively called, first on the left partition and next on the right partition of the array (Note: a pivot partitions the array into left and right). We implemented the array as a memory module with AW=10 and DW=32, with 1 read and 1 write port. We implemented the stack (for recursive function calls) also as a memory module with AW=10 and DW=24, with 1 read and 1 write port. The design has 200 latches (excluding memory registers), 56 inputs, and ~9K 2-input gates. We chose two properties: a) P1: the first element of the sorted array (in ascending order) can not be greater than the second element, b) P2: after return from a recursive call, the program counter should go next to a recursive call on the right partition or return to the parent on the recursion stack. The array is allowed to have arbitrary values to begin with. This requires precise handling of the arbitrary initial memory state (equation (6)) to show the correctness of the property.

For different array sizes N, we compared the performance of EMM and Explicit Modeling approaches, using the forward induction proof checks in BMC-3 and BMC-1 respectively. We used a time limit of 3 hours for each run. We present the results in Table 7. Column 1 shows different array sizes N; Column 2 shows the properties; Column 3 shows the forward proof diameter; Columns 4-5 and 6-7 show performance time and space used by EMM and Explicit Modeling, respectively. Note that using EMM we were able to prove all properties in the given time limit, while Explicit Modeling simply times out.

TABLE 7

Performance summary on Quick Sort

| | | | EMM | | Explicit | |
|---|---|---|---|---|---|---|
| N | Prop | D | Sec | MB | Sec | MB |
| 3 | P1 | 27 | 64 | 55 | >3 hr | NA |
| 3 | P2 | 27 | 30 | 44 | >3 hr | NA |
| 4 | P1 | 42 | 601 | 105 | >3 hr | NA |
| 4 | P2 | 42 | 453 | 124 | >3 hr | NA |
| 5 | P1 | 59 | 6376 | 423 | >3 hr | NA |
| 5 | P2 | 59 | 4916 | 411 | >3 ht | NA |

Note that property P1 depends on both the array and the stack, while property P2 depends on only the stack for correctness. In other words, for P2, the contents of the array should not matter at all. We used the PBA technique to examine this.

For property P2, we compared performance of EMM with PBA using BMC-3, with that of PBA on Explicit Modeling using BMC-1. We used a stability depth of 10 to obtain the stable set LR. We present the results in Table 8.

Column 1 shows different array sizes N, Columns 2-5 show performance figures for EMM. Specifically, Column 2 shows the number of latches in the reduced model size using EMM with PBA. The value in bracket shows the original number of latches. Column 3 shows the time taken (in sec) for PBA to generate a stable latch set. Columns 4-5 show the time and memory required for EMM to provide the forward induction proof. Columns 6-9 report these performance numbers for the Explicit Modeling.

It is interesting to note that by use of PBA, the reduced model in Column 2 did not have any latch from the control logic of the memory module representing the array. Therefore, we were able to automatically abstract out the entire array memory module, while doing BMC analysis on the reduced model using EMM. Note that this results in significant improvement in performance, as clear from a comparison of the performance figures of EMM on property P2 in columns 4-5 of Tables 7 and 8. Moreover, we see several orders of magnitude performance improvement over the Explicit Modeling, even on the reduced models. Note, for N=5 we could not generate a stable latch model in the given time limit for the Explicit Modeling case.

TABLE 8

Performance summary on Quick Sort on P2

| | EMM + PBA | | EMM-Proof on Red. Model | | Explicit + PBA | | Explicit on Red. Model | |
|---|---|---|---|---|---|---|---|---|
| N | FF (orig) | Sec | Sec | MB | FF (orig) | Sec | Sec | MB |
| 3 | 91 (167) | 10 | 5 | 13 | 293 (37K) | 293 | 2K | 274 |
| 4 | 93 (167) | 38 | 145 | 40 | 2858 (37K) | 2858 | 10K | 456 |
| 5 | 91 (167) | 351 | 2316 | 116 | −(37K) | >3 hr | NA | NA |

Case Study on Industry Design I: This case study makes use of our approach of EMM for multiple memories and EMM with induction proofs. The industry design is a low-pass image filter with 756 latches (excluding the memory registers), 28 inputs and ~15K 2-input gates. It has two memory modules, both having address width, AW=10 and data width, DW=8. Each module has 1 write and 1 read port, with memory state initialized to 0. There are 216 reachability properties.

EMM: We were able to find witnesses for 206 of the 216 properties, in about 400s requiring 50 Mb. The maximum depth over all witnesses was 51. For the remaining 10 properties, we were able to obtain the proofs by induction using BMC-3, in less than 1s requiring 6 Mb. Note that the introduction of new variables to model arbitrary initial memory state, without the constraints in equation (6), was sufficient for the proofs although they capture extra behavior in the verification model.

Explicit Modeling: We required 20540s (~6 Hrs) and 912 Mb to find witnesses for all 206 properties. For the remaining 10 properties, we were able to obtain the proofs by induction using BMC-1 in 25s requiring 50 Mb.

Case Study on Industry Design II: This case study makes use of EMM for memory with multiple ports, and for finding invariants that can aid proofs by induction. The design has 2400 latches (excluding the memory registers), 103 inputs and ~46K 2-input gates. It has one memory module with AW=12 and DW=32. The memory module has 1 write port and 3 read ports, with memory state initialized to 0. There are 8 reachability properties.

We found spurious witnesses at depth 7 for all properties, if we abstract out the memory completely. Thus, we needed to include the memory module. Using EMM, we were not able to find any witnesses for these properties up to depths of 200 in about 10s. Next, we tried obtaining a proof of unreachability for all depths. Using EMM with PBA, we were able to reduce the model to about 100 latches requiring 4-5 minutes. However, the model was not small enough for our BDD-based model checker or SAT-based BMC to provide a proof. We also noticed that the WE (write enable) control signal stayed inactive in the forward search of 200 depth. Observing that, we hypothesized that the memory state does not get updated, i.e., it remains in its initial state. This is expressed using the following LTL property:

$G(WE=0 \text{ or } WD=0);$ i.e., always, either the write enable is inactive or the write data (WD) is 0. Using BMC-3, we were able to prove the above property using backward induction at depth 2 in less than 1 s. Explicit Modeling using BMC-1 takes 78s to prove the same.

The above invariant implies that the data read is always 0 (could potentially be a design bug). Next we abstracted out the memory, but applied this constraint to the input read data signals. We used PBA to further reduce the design to only 20-30 s latches for each property (taking about a minute). We then proved each property unreachable on the reduced model using forward induction proof in BMC-1 in less than 1 s. (Our BDD-based model checker was unable to build even the transition relation for these abstract models.)

Of course, it will be understood by those skilled in the art that the foregoing is merely illustrative of the principles of this invention, and that various modifications can be made by those skilled in the art without departing from the scope and spirit of the invention. Accordingly, our invention is to be limited only by the scope of the claims attached hereto.

The invention claimed is:

1. A computer implemented method of modeling an electronic design having one or more embedded memories, such that some or all of the memory bits comprising the one or more embedded memories need not be explicitly modeled, the method comprising the steps of:
    removing, one or more of the memories from the design while retaining data forwarding semantics of a memory read operation;
    capturing, the data forwarding semantics and memory preservation constraints for preserving an arbitrary initial memory state as Efficient Memory Modeling (EMM) constraints in a suitable representation wherein said EMM is a memory modeling technique where memory semantics is maintained without using an explicit register array model and said EMM constraints do not create structure where intermediate variables do not fan-out and do not create unnecessary 2-literal clauses; and
    verifying, the design using a suitable bounded analysis; and
    generating an output indicative of the verification
    wherein according to the data forwarding semantics, a memory read operation from a memory address returns a data value that was last written at that same memory address in a previous memory write operation or, if there is no previous write operation at that address then the memory read operation returns the initial data value.

2. The method according to claim 1 further comprising the step(s) of:
    adding exclusivity constraints to the suitable representation such that when a valid matching read and write combination is determined, other read and write combinations are immediately implied invalid as a result of the exclusivity constraints;
    wherein said exclusivity constraints refer to those constraints that capture matching read and write operations for a memory address, explicitly.

3. The method according to claim 1, wherein the capturing step uses proof-based abstractions (PBA) in addition to EMM.

4. The method according to claim 3, further comprising the step(s) of:
    automatically determining, through the use of PBA irrelevant memories and irrelevant ports, such that the corresponding EMM constraints are removed during verification.

5. The method according to claim 4, further comprising the step(s) of:
    removing, during the verification step, any corresponding EMM constraints.

6. The method according to claim 1, wherein the suitable representation is a hybrid representation that includes both a circuit formulation and a clausal formulation.

7. The method according to claim 1 wherein the verifying step includes a SAT-based bounded analysis.

8. The method according to claim 2 wherein the verifying step includes a SAT-based bounded analysis.

9. The method according to claim 1 wherein the verifying step includes a proof by induction.

10. The method according to claim 2 wherein the verifying step includes a proof by induction.

11. The method according to claim 1 wherein the verifying step includes a SAT-based induction.

12. The method according to claim 2 wherein the verifying step includes a SAT-based induction.

13. The method according to claim 1 wherein the verifying step includes an equivalence checking.

14. The method according to claim 2 wherein the verifying step includes an equivalence checking.

15. A computer implemented method of modeling an electronic design having one or more embedded memories, wherein the modeling is performed such that some or all of the memory bits comprising the one or more embedded memories need not be explicitly modeled, the modeling method comprising the steps of:
    removing, one or more of the memories from the design while retaining data forwarding semantics of a memory read operation;
    capturing, the data forwarding semantics as Efficient Memory Modeling (EMM) constraints in a suitable representation wherein said EMM is a memory modeling technique where memory semantics is maintained without using an explicit register array model and said EMM constraints do not create structure where intermediate variables do not fan-out and do not create unnecessary 2-literal clauses;
    adding exclusivity constraints to the representation; and
    verifying, the design using a suitable bounded analysis such that when a valid matching read and write combination is determined, other combinations are immediately implied invalid as a result of the exclusivity constraints; and
    generating an output indicative of the verification
    wherein according to the data forwarding semantics, a memory read operation from a memory address returns a data value that was last written at that same memory address in a previous memory write operation or, if there is no previous write operation at that address then the memory read operation returns the initial data value.

16. The method according to claim 15 further comprising the step(s) of:
    utilizing, proof-based abstractions (PBA) in addition to EMM during the capturing step.

17. The method according to claim 16 further comprising the step(s) of:
    automatically determining, through the use of PBA, irrelevant memories and irrelevant ports, such the corresponding EMM constraints are removed during verification.

18. The method according to claim 17, further comprising the step(s) of:
  removing, during the verification step, any corresponding EMM constraints.

19. The method according to claim 15, wherein the suitable representation is a hybrid representation that includes both a circuit formulation and a clausal formulation.

20. The method according to claim 18, wherein the suitable representation is a hybrid representation that includes both a circuit formulation and a clausal formulation.

21. The method according to claim 15 wherein the verifying step includes a SAT-based bounded analysis.

22. The method according to claim 18 wherein the verifying step includes a SAT-based bounded analysis.

* * * * *